United States Patent [19]

Ahn

[11] Patent Number: 5,539,702
[45] Date of Patent: Jul. 23, 1996

[54] TEST APPARATUS FOR SEMI-CONDUCTOR MEMORY DEVICE

[75] Inventor: Yeong-Chang Ahn, Seoul, Rep. of Korea

[73] Assignee: Goldstar Electron Co., Ltd., Choongchungbook-Do, Rep. of Korea

[21] Appl. No.: 195,069

[22] Filed: Feb. 14, 1994

[30] Foreign Application Priority Data

Feb. 15, 1993 [KR] Rep. of Korea .................... 2082/1993

[51] Int. Cl.[6] ...................................................... G11C 7/02
[52] U.S. Cl. .......................... 365/210; 365/201; 371/25.1
[58] Field of Search ................................. 371/21.2, 21.1, 371/22.2, 25.1, 15.1; 365/201, 210, 210.1

[56] References Cited

U.S. PATENT DOCUMENTS

| | | | |
|---|---|---|---|
| 4,344,127 | 8/1982 | McDaniel et al. | 364/130 |
| 4,811,294 | 3/1989 | Kobayashi et al. | 365/189 |
| 5,060,230 | 10/1991 | Arimoto et al. | 371/21.2 |
| 5,148,398 | 9/1992 | Kohno | 365/201 |

OTHER PUBLICATIONS

"A 60-ns 4-Mbit CMOS DRAM with Built-In Self-Test Function", by Takashi OHSAWA et al., IEEE Journal of Solid-State Circuits, vol. SC-22, No. 5, Oct. 1987, pp. 663-667.

*Primary Examiner*—Robert W. Beausoliel, Jr.
*Assistant Examiner*—Phung M. Chung
*Attorney, Agent, or Firm*—Lowe, Price, LeBlanc & Becker

[57] ABSTRACT

A test apparatus for a semi-conductor memory device comprising a memory section having a plurality of memory cell arrays, the memory cell arrays receiving input data in parallel, a latch control circuit responsive to a write enable signal and an address signal for outputting a control signal for latching the input data while the input data is written into the memory section, an expected data latch circuit responsive to the control signal from the latch control circuit and a read enable signal for latching the input data while the input data is written into the memory section and outputting the resultant expected data, a clock generator for generating a clock signal in response to a test flag signal and an internal column address select signal, an expected data transfer circuit for transferring the expected data from the expected data latch circuit in response to the test enable signal and the read enable signal, a data discrimination circuit for discriminating whether output data from the memory section are the same as the expected data from the expected data transfer circuit, and an output circuit for outputting a fail signal in response to output signals from the data discrimination circuit.

6 Claims, 3 Drawing Sheets

| CIRCUIT | | | | | |
|---|---|---|---|---|---|
| Din | AI0 | AI1 | AI2 | AI3 | Dout |
| 0 | 0 | 0 | 0 | 0 | 1 |
| 0 | 0 | 0 | 0 | 1 | 0 |
| 0 | 1 | 1 | 1 | 1 | 1 |
| 1 | 1 | 1 | 1 | 1 | 1 |
| 1 | 1 | 1 | 1 | 0 | 0 |
| 1 | 0 | 0 | 0 | 0 | 1 |

FIG. 4

| Din | AI0 | AI1 | AI2 | AI3 | Dout |
|---|---|---|---|---|---|
| | | CIRCUIT | | | |
| 0 | 0 | 0 | 0 | 0 | 1 |
| 0 | 0 | 0 | 0 | 1 | 0 |
| 0 | 1 | 1 | 1 | 1 | 0 |
| 1 | 1 | 1 | 1 | 1 | 1 |
| 1 | 1 | 1 | 1 | 0 | 0 |
| 1 | 0 | 0 | 0 | 0 | 0 |

TEST APPARATUS FOR SEMI-CONDUCTOR MEMORY DEVICE

BACKGROUND OF THE INVENTION

1. Field of the Invention

The present invention relates in general to the test of semi-conductor memory devices, and more particularly to a test apparatus for a semi-conductor memory device in which data written in a memory cell array and data read therefrom are compared with each other so that a failure of the memory cell array can accurately be checked.

2. Description of the Prior Art

Referring to FIG. 1, there is shown a detailed circuit diagram of a conventional test apparatus for a semi-conductor memory device. As shown in this drawing, the conventional test apparatus comprises a memory section 1 having a plurality of memory cell arrays M11–M14, each of which stores input data Din.

Also, the conventional test apparatus comprises a data discrimination circuit 2 for checking the data stored in the memory cell arrays M11–M14 of the memory section 1 to discriminate a failure thereof, and an output circuit 3 for outputting a fail signal Dout in response to output signals from the data discrimination circuit 2.

The data discrimination circuit 2 includes a NAND gate ND1 for NANDing data AI0–AI3 read from the memory cell arrays M11–M14 in the memory section 1, an OR gate OR1 for ORing the data AI0–AI3 read from the memory cell arrays M11–M14, a NAND gate ND2 for NANDing inverted ones BI0–BI3 of the data AI0–AI3 read from the memory cell arrays M11–M14, an OR gate OR2 for ORing the inverted ones BI0–BI3 of the data AI0–AI3 read from the memory cell arrays M11–M14, a NAND gate ND3 for NANDing output signals from the NAND gate ND1 and the OR gate OR1, and an AND gate AND1 for ANDing output signals from the NAND gate ND2 and the OR gate OR2.

The output circuit 3 includes a pair of NMOS transistors MN1 and MN2. The NMOS transistor MN1 is turned on/off in response to an output signal from the NAND gate ND3. The NMOS transistor MN2 is turned on/off in response to an output signal from the AND gate AND1.

The operation of the conventional test apparatus with the above-mentioned construction will hereinafter be described with reference to FIGS. 1 and 2. FIG. 2 is a view illustrating logical states of the input data Din, the data read from the memory cell arrays M11–M14 in FIG. 1 and the fail signal Dout from the output circuit 3 in FIG. 1.

First, the input data Din is written in parallel into the memory cell arrays M11–M14 in the memory section 1. If the input data Din is logically low, the data AI0–AI3 are read from the memory cell arrays M11–M14 as shown in FIG. 2 and then applied to the data discrimination circuit 2.

In the data discrimination circuit 2, the data AI0–AI3 read from the memory cell arrays M11–M14 are NANDed by the NAND gate ND1 and ORed by the OR gate OR1. If all the data AI0–AI3 read from the memory cell arrays M11–M14 are logically low, the output signal from the NAND gate ND1 is logically high, whereas the output signal from the OR gate OR1 is logically low.

The high output signal from the NAND gate ND1 and the low output signal from the OR gate OR1 are NANDed by the NAND gate ND3, the output signal from which is thus logically high. The high output signal from the NAND gate ND3 is applied to the output circuit 3.

Also, the inverted ones BI0–BI3 of the data AI0–AI3 read from the memory cell arrays M11–M14 are NANDed by the NAND gate ND2 and ORed by the OR gate OR2. All the inverted ones BI0–BI3 of the data AI0–AI3 read from the memory cell arrays M11–M14 are logically high because all the data AI0–AI3 read from the memory cell arrays M11–M14 are logically low. As a result, the output signal from the NAND gate ND2 is logically low, whereas the output signal from the OR gate OR2 is logically high.

The low output signal from the NAND gate ND2 and the high output signal from the OR gate OR2 are ANDed by the AND gate AND1, the output signal from which is thus logically low. The low output signal from the AND gate AND1 is applied to the output circuit 3.

In the output circuit 3, the high output signal from the NAND gate ND3 in the data discrimination circuit 2 is applied to a gate of the NMOS transistor MN1 and the low output signal from the AND gate AND1 in the data discrimination circuit 2 is applied to a gate of the NMOS transistor MN2. As a result, the NMOS transistor MN1 is turned on and the NMOS transistor MN2 is turned off, thereby causing the fail signal Dout from the output circuit 3 to become logically high.

On the other hand, in the case where the input data Din is logically high, all the data AI0–AI2 read from the memory cell arrays M11–MI3 are logically high and the data AI3 read from the memory cell array M14 is logically low, all the inverted ones BI0–BI2 of the data AI0–AI2 read from the memory cell arrays M11–M13 are logically low and the inverted one BI3 of the data AI3 read from the memory cell array M14 is logically high. In this case, in the data discrimination circuit 2, the output signal from the NAND gate ND1 is logically high and the output signal from the OR gate OR1 is logically high. As a result, the output signal from the NAND gate ND3 is logically low. Also, the output signal from the NAND gate ND2 is logically high and the output signal from the OR gate OR2 is logically high. As a result, the output signal from the AND gate AND1 is logically high. Then, the low output signal from the NAND gate ND3 and the high output signal from the AND gate AND1 are applied to the output circuit 3.

Subsequently, in the output circuit 3, the low output signal from the NAND gate ND3 in the data discrimination circuit 2 is applied to the gate of the NMOS transistor MN1 and the high output signal from the AND gate AND1 in the data discrimination circuit 2 is applied to the gate of the NMOS transistor MN2. In response to the low output signal from the NAND gate ND3 and the high output signal from the AND gate AND1, the NMOS transistor MN1 is turned off and the NMOS transistor MN2 is turned on. As a result, the fail signal Dout from the output circuit 3 becomes logically low.

In this manner, the fail signal Dout from the output circuit 3 is outputted as shown in FIG. 2 according to the output data from the memory section 1 and the output signals from the data discrimination circuit 2. The high state of the fail signal Dout from the output circuit 3 means that the memory cell arrays M11–M14 are normally operated. On the contrary, the low state of the fail signal Dout from the output circuit 3 means that the memory cell arrays M11–M14 are abnormally operated.

However, the conventional test apparatus has a disadvantage in that the normal states of the memory cell arrays may be discriminated even when data written in each memory cell array is not the same as that read therefrom. Namely, as shown in FIG. 2, all the data read from the memory cell arrays may be the same even in the case where data written in each memory cell array is not the same as that read therefrom. For this reason, a failure of the memory cell array cannot be discriminated accurately.

SUMMARY OF THE INVENTION

Therefore, the present invention has been made in view of the above problem, and it is an object of the present invention to provide a test apparatus for a semi-conductor memory device in which data written in a memory cell array and data read therefrom are compared with each other so that a failure of the memory cell array can accurately be checked.

In accordance with the present invention, the above and other objects can be accomplished by a provision of a test apparatus for a semi-conductor memory device comprising memory means having a plurality of memory cell arrays, said memory cell arrays receiving input data in parallel, latch control means responsive to a write enable signal and an address signal for outputting a control signal for latching the input data while the input data is written into said memory means, expected data latch means responsive to the control signal from said latch control means and a read enable signal for latching the input data while the input data is written into said memory means and outputting the resultant expected data, clock generation means for generating a clock signal in response to a test flag signal and an internal column address select signal, expected data transfer means for transferring the expected data from said expected data latch means in response to the test enable signal and the read enable signal, data discrimination means for discriminating whether output data from said memory means are the same as the expected data from said expected data transfer means; and output means for outputting a fail signal in response to output signals from said data discrimination means.

BRIEF DESCRIPTION OF THE DRAWINGS

The above and other objects, features and advantages of the present invention will be more clearly understood from the following detailed description taken in conjunction with the accompanying drawings, in which:

FIG. 4 is a view illustrating logical states of input data, data read from memory cell arrays in FIG. 3 and a fail signal from an output circuit in FIG. 3 in accordance with the present invention.

DETAILED DESCRIPTION OF THE PREFERRED EMBODIMENT

Figure 3:
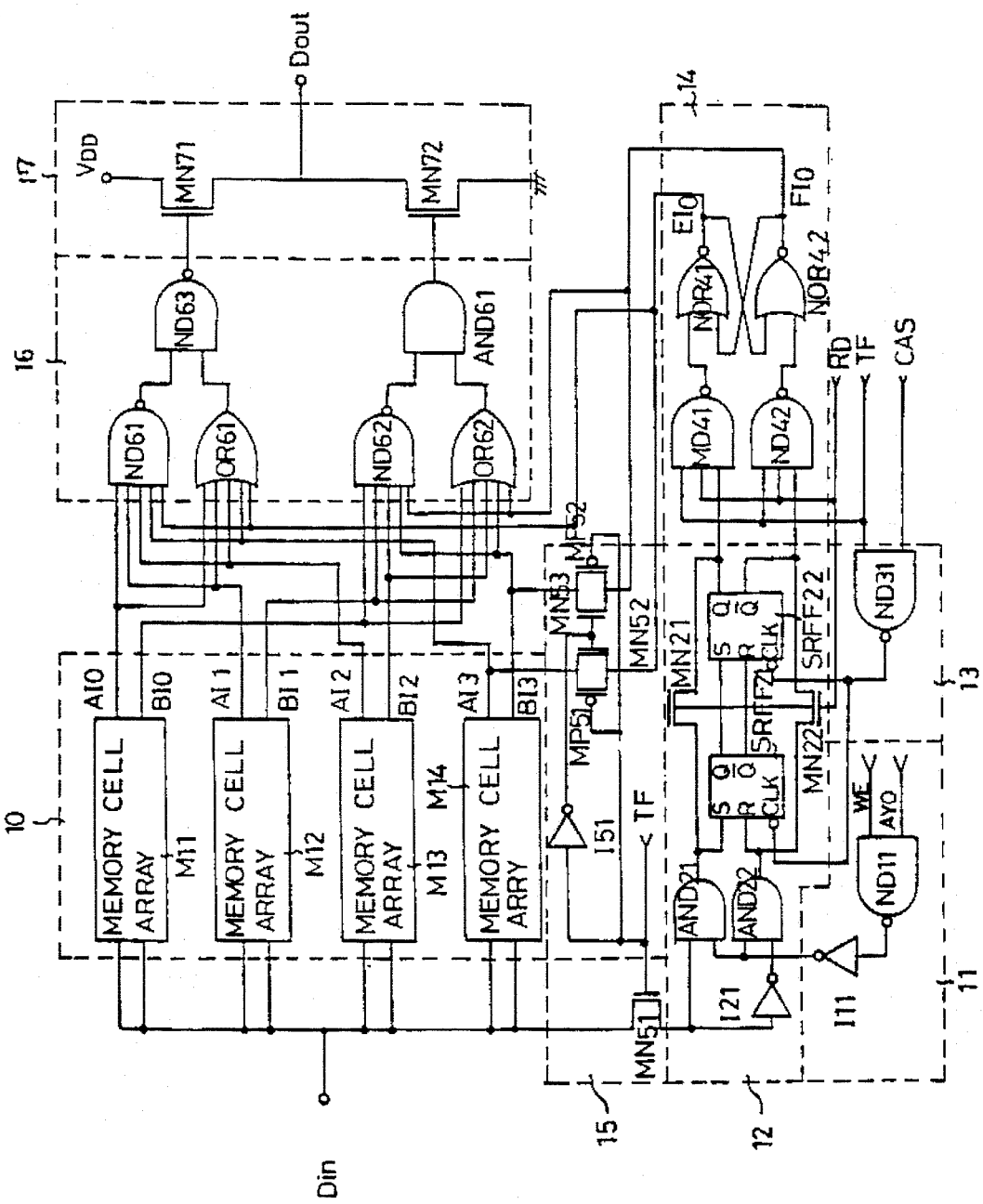
FIG. 3 is a detailed circuit diagram of a test apparatus for a semi-conductor memory device in accordance with the present invention.

Referring to FIG. 3, there is shown a detailed circuit diagram of a test apparatus for a semi-conductor memory device in accordance with the present invention. As shown in this drawing, the test apparatus comprises a memory section 10 having a plurality of memory cell arrays M11–M14. The memory cell arrays M11–M14 receives input data Din in parallel.

A latch control circuit 11 is responsive to a write enable signal WE and an address signal AYO to output a control signal for latching the input data Din while the input data Din is written into the memory section 10. The latch control circuit 11 includes a NAND gate ND11 and an inverter I11.

An expected data latch circuit 12 is responsive to the control signal from the latch control circuit 11 and a read enable signal RD to latch the input data Din while the input data Din is written into the memory section 10 and output the resultant expected data EIO and FIO. The expected data latch circuit 12 includes an inverter I21, AND gates AND21 and AND22, SR flip-flops SRFF21 and SRFF22, and NMOS transistors MN21 and MN22.

A clock generator 13 is also provided in the test apparatus to generate a clock signal in response to a test flag signal TF and an internal column address select signal CAS. The clock generator 13 includes a NAND gate ND31.

An expected data transfer circuit 14 is also provided in the test apparatus to transfer the expected data EIO and FIO from the expected data latch circuit 12 in response to the test enable signal TF and the read enable signal RD. The expected data transfer circuit 14 includes NAND gates ND41 and ND42, and NOR gates NOR41 and NOR42.

A data transmission circuit 15 is also provided in the test apparatus to stop the latching operation of the input data Din in the expected data latch circuit 12 and transmit output data AI3 and BI3 from the memory section 10 as the expected data if the test flag signal TF is logically low. The data transmission circuit 15 includes NMOS transistors MN51–MN53, PMOS transistors MP51 and MP52, and an inverter I51.

A data discrimination circuit 16 is also provided in the test apparatus to discriminate whether output data AI0–AI3 and BI0–BI3 from the memory section 10 are the same as the expected data EIO and FIO or AI3 and BI3. The data discrimination circuit 16 includes NAND gates ND61–ND63, OR gates OR61 and OR62, and an AND gate AND61.

An output circuit 17 is adapted to output a fail signal Dout in response to output signals from the data discrimination circuit 16. The output circuit 17 includes NMOS transistors MN71 and MN72.

In the latch control circuit 11, the NAND gate ND11 NANDs the write enable signal WE and the address signal AYO. The inverter I11 inverts an output signal from the NAND gate ND11 and outputs the inverted signal as the latch control signal.

In the clock generator 13, the NAND gate ND31 NANDs the test flag signal TF and the internal column address select signal CAS and outputs the NANDed signal as the clock signal.

In the expected data latch circuit 12, the inverter I21 inverts the input data Din. The AND gate AND21 ANDs the input data Din and the control signal from the latch control circuit 11 and the AND gate AND22 ANDs the input data inverted by the inverter I21 and the control signal from the latch control circuit 11. The SR flip-flop SRFF21 has a set terminal S for inputting an output signal from the AND gate AND21, a reset terminal R for inputting an output signal from the AND gate AND22 and a clock terminal CLK for inputting the clock signal from the clock generator 13. The SR flip-flop SRFF22 has a set terminal S for inputting a non-inverting output signal Q from the SR flip-flop SRFF21, a reset terminal R for inputting an inverting output signal /Q from the SR flip-flop SRFF21 and a clock terminal CLK for inputting the clock signal from the clock generator 13. The NMOS transistor MN21 feeds back a non-inverting output signal Q from the SR flip-flop SRFF22 to the set terminal S of the SR flip-flop SRFF21 by one bit if the read enable signal RD is logically high. The NMOS transistor MN22 feeds back an inverting output signal /Q from the SR flip-flop SRFF22 to the reset terminal R of the SR flip-flop SRFF21 by one bit if the read enable signal RD is logically high.

In the data transmission circuit 15, the NMOS transistor MN51 acts to block the transfer of the input data Din to the expected data latch circuit 12 in response to the test flag signal TF. The inverter I51 inverts the test flag signal TF. The NMOS transistors MN52 and MN53 are turned on/off in response to the test flag signal TF inverted by the inverter I51 and the PMOS transistors MP51 and MP52 are turned on/off in response to the test flag signal TF to transmit the output data AI3 and BI3 from the memory section 10 as the expected data if the test flag signal TF is logically low.

In the expected data transfer circuit 14, the NAND gate ND41 NANDs the non-inverting output signal Q from the SR flip-flop SRF22 in the expected data latch circuit 12, the read enable signal RD and the test flag signal TF. The NAND gate ND42 NANDs the inverting output signal /Q from the SR flip-flop SRFF22 in the expected data latch circuit 12, the read enable signal RD and the test flag signal TF. The NOR gate NOR41 has one input terminal connected to an output terminal of the NAND gate ND41 and the other input terminal connected to an output terminal of the NOR gate NOR42. The NOR gate NOR42 has one input terminal connected to an output terminal of the NAND gate ND42 and the other input terminal connected to an output terminal of the NOR gate NOR41.

Figures 1, 2:
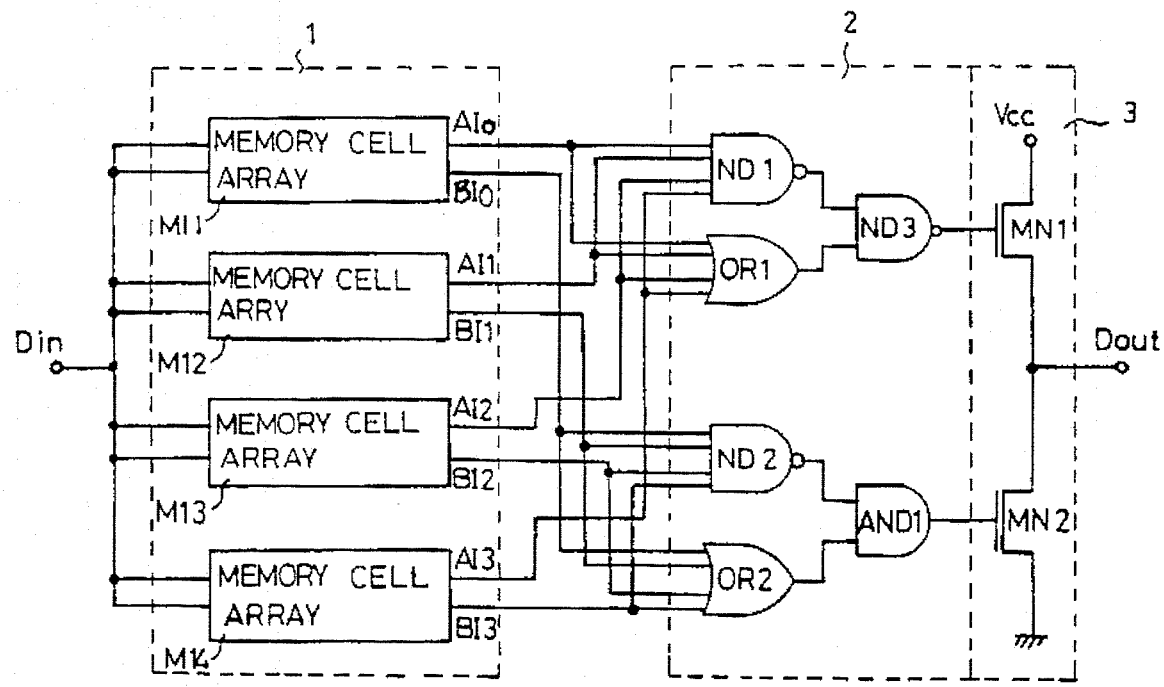
FIG. 1 is a detailed circuit diagram of a conventional test apparatus for a semi-conductor memory device.
FIG. 2 is a view illustrating logical states of input data, data read from memory cell arrays in FIG. 1 and a fail signal from an output circuit in FIG. 1 in accordance with the prior art.

The constructions of the data discrimination circuit 16 and output circuit 17 are substantially the same as those of the data discrimination circuit 2 and output circuit 3 in FIG. 1 and a detailed description thereof will thus be omitted.

The operation of the test apparatus with the above-mentioned construction in accordance with the present invention will hereinafter be described in detail with reference to FIGS. 3 and 4. FIG. 4 is a view illustrating logical states of the input data Din, the data read from the memory cell arrays M11–M14 in FIG. 3 and the fail signal Dout from the output circuit 17 in FIG. 3.

In accordance with the present invention, the test flag signal TF is not generated by the conventional write enable signal WE but by detecting the high potential state of the the WCBR (/WE,/CAS Before/RAS) signal and Address Pin (AO), such as the address signal AY0

First, if the test flag signal TF is logically high, the NMOS transistor MN51 in the data transmission circuit 15 is turned on, thereby causing the input data Din to be written in parallel into the memory cell arrays M11–M14 in the memory section 10 and to be applied to the expected data latch circuit 12. In the expected data latch circuit 12, the input data Din is applied to one input terminal of the AND gate AND21 and through the inverter I21 to one input terminal of the AND gate AND22.

At this time, both the write enable signal WE and the address signal AY0 become logically high. In the latch control circuit 11, the high write enable signal WE and the high address signal AY0 are NANDed by the NAND gate ND11 and then inverted by the inverter I11. The output signal from the inverter I11 is applied as the latch control signal to the other input terminals of the AND gates AND21 and AND22 in the expected data latch circuit 12. As a result, the data Din transferred through the data transmission circuit 15 is latched by the SR flip-flops SRFF21 and SRFF22 in response to the high control signal from the latch control circuit 11 and the clock signal CLK from the clock generator 13.

The clock signal CLK is generated by NANDing the test flag signal TF and the internal column address select signal CAS by means of the NAND gate ND31 in the clock generator 13.

Noticeably, the expected data latch circuit 12 includes the two SR flip-flops SRFF21 and SRFF22 for the purpose of the use of the output data as checker board data as well as solid data.

Then, when the read enable signal RD goes high, the input data Din is not latched by the expected data latch circuit 12 because the write enable signal WE goes low.

In the case where the read enable signal RD is enabled, the internal column address select signal CAS is clocked and the test flag signal TF is high, the data latched by the SR flip-flops SRFF21 and SRFF22 in the expected data latch circuit 12 are applied through the expected data transfer circuit 14 to the data discrimination circuit 16.

The expected data EIO and FIO from the expected data transfer circuit 14 are fed back by one bit to the SR flip-flops SRFF21 and SRFF22 in the expected data latch circuit 12 by the NMOS transistors MN21 and MN22 therein. The feedback of the expected data is enabled only when the read enable signal RD is high. The expected data FIO is an inverted one of the expected data EIO.

In the data discrimination circuit 16, the expected data EIO from the expected data transfer circuit 14 and the data AI0–AI3 read from the memory cell arrays M11–M14 are NANDed by the NAND gate ND61 and ORed by the OR gate OR61. Also, the expected data FIO from the expected data transfer circuit 14 and the inverted ones BI0–BI3 of the data AI0–AI3 read from the memory cell arrays M11–M14 are NANDed by the NAND gate ND62 and ORed by the OR gate OR62. The output signal from the NAND gate ND61 and the output signal from the OR gate OR61 are NANDed by the NAND gate ND63. Also, the output signal from the NAND gate ND62 and the output signal from the OR gate OR62 are ANDed by the AND gate AND61. The output signal from the NAND gate ND63 and the output signal from the AND gate AND61 are applied to the output circuit 17.

In the output circuit 17, the output signal from the NAND gate ND63 in the data discrimination circuit 16 is applied to a gate of the NMOS transistor MN71 and the output signal from the AND gate AND61 in the data discrimination circuit 16 is applied to a gate of the NMOS transistor MN72. As a result, the NMOS transistors MN71 and MN72 are turned on/off, thereby causing the fail signal Dout to be outputted from the output circuit 17.

Therefore, as shown in FIG. 4, the fail signal Dout is outputted from the output circuit 17 when the data AI0–AI3 are read from the memory cell arrays M11–M14 in the memory section 10.

On the other hand, in the case where the test flag signal TF is logically low, the input data Din is not applied to the expected data latch circuit 12. Namely, in the data transmission circuit 15, the NMOS transistor MN51 is turned off in response to the low test flag signal TF, thereby causing the input data Din to be written in parallel into the memory cell arrays M11–M14 in the memory section 10 and not to be applied to the expected data latch circuit 12. Also, the low test flag signal TF is inverted by the inverter I51 and then applied to gates of the NMOS transistors MN52 and MN53. As a result, the NMOS transistors MN52 and MN53 are turned on, thereby causing the expected data EIO and FIO from the expected data transfer circuit 14 not to be transferred to the data discrimination circuit 16. In this case, the output data AI3 and BI3 from the memory section 10 are applied as the expected data to the data discrimination circuit 16.

As apparent from the above description, according to the present invention, the data written in each memory cell array and the data read therefrom cell are compared with each other. Therefore, the failure of the memory cell array can accurately be checked. This has the effect of broadening the range of the failure detection and increasing the test reliability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A test apparatus for a semi-conductor memory device comprising:

memory means having a plurality of memory cell arrays, said memory cell arrays receiving input data in parallel;

latch control means responsive to a write enable signal and an address signal for outputting a control signal for latching the input data while the input data is written into said memory means;

expected data latch means responsive to the control signal from said latch control means and a read enable signal for latching the input data while the input data is written into said memory means;

clock generation means for generating a clock signal for clocking the expected data latch means in response to a test flag signal and an internal column address select signal;

expected data transfer means for transferring data from said expected data latch means in response to a test enable signal and the read enable signal;

data discrimination means for discriminating whether output data from said memory means are the same as the expected data from said expected data transfer means; and output means for outputting a fail signal in response to output signals from said data discrimination means.

2. The test apparatus for a semi-conductor memory device as set forth in claim 1, wherein said latch control means includes:

a NAND gate for NANDing the write enable signal and the address signal; and an inverter for inverting an output signal from said NAND gate and outputting the inverted signal as the latch control signal.

3. The test apparatus for a semi-conductor memory device as set forth in claim 1, wherein said clock generation means includes:

a NAND gate for NANDing the test flag signal and the internal column address select signal and outputting the NANDed signal as the clock signal.

4. The test apparatus for a semi-conductor memory device as set forth in claim 1, wherein said expected data latch means includes:

an inverter for inverting the input data;

a first AND gate for ANDing the input data and the control signal from said latch control means;

a second AND gate for ANDing the input data inverted by said inverter and the control signal from said latch control means;

a first SR flip-flop having a set terminal for inputting an output signal from said first AND gate, a reset terminal for inputting an output signal from said second AND gate and a clock terminal for inputting the clock signal from said clock generation means;

a second SR flip-flop having a set terminal for inputting a non-inverting output signal from said first SR flip-flop, a reset terminal for inputting an inverting output signal from said first SR flip-flop and a clock terminal for inputting the clock signal from said clock generation means;

a first NMOS transistor for feeding back a non-inverting output signal from said second SR flip-flop to the set terminal of said first SR flip-flop by one bit if the read enable signal is logically high; and a second NMOS transistor for feeding back an inverting output signal from said second SR flip-flop to the reset terminal of said first SR flip-flop by one bit if the read enable signal is logically high.

5. The test apparatus for a semi-conductor memory device as set forth in claim 1, further comprising:

data transmission means for stopping the latching operation of the input data in said expected data latch means and transmitting the output data from said memory means as the expected data to said data discrimination means if the test flag signal is logically low.

6. The test apparatus for a semi-conductor memory device as set forth in claim 5, wherein said data transmission means includes:

a first NMOS transistor for blocking the transfer of the input data to said expected data latch means in response to the test flag signal;

an inverter for producing an inverted test flag signal; and second and third NMOS transistors turned on/off in response to the inverted test flag signal and first and second PMOS transistors turned on/off in response to the test flag signal, for transmitting the output data from said memory means as the expected data if the test flag signal is logically low.

\* \* \* \* \*